(12) United States Patent
Chen

(10) Patent No.: US 8,143,638 B2
(45) Date of Patent: Mar. 27, 2012

(54) LIGHT EMITTING DIODE PACKAGE STRUCTURE AND METHOD THEREOF

(75) Inventor: Chin-Ching Chen, Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 251 days.

(21) Appl. No.: 12/691,740

(22) Filed: Jan. 22, 2010

(65) Prior Publication Data
US 2010/0187553 A1 Jul. 29, 2010

(30) Foreign Application Priority Data
Jan. 23, 2009 (TW) .............................. 98102914 A

(51) Int. Cl.
*H01L 33/00* (2010.01)
(52) U.S. Cl. ............ 257/98; 257/E33.067; 257/E33.072
(58) Field of Classification Search .................... 257/98, 257/E33.067, E33.072; 438/26, E21.499
See application file for complete search history.

(56) References Cited

U.S. PATENT DOCUMENTS

| 4,189,205 A | 2/1980 | Vandehei |
| 6,855,369 B2 * | 2/2005 | Nakamura et al. ............. 427/164 |
| 7,622,746 B1 * | 11/2009 | Lester et al. ..................... 257/98 |
| 7,679,702 B2 * | 3/2010 | Oura et al. ..................... 349/117 |
| 2011/0063592 A1 * | 3/2011 | Ezura et al. ...................... 355/53 |

FOREIGN PATENT DOCUMENTS
JP 10-215001 8/1998

* cited by examiner

*Primary Examiner* — Victor A Mandala
(74) *Attorney, Agent, or Firm* — Jianq Chyun IP Office

(57) ABSTRACT

An LED package structure includes a carrier substrate, a reflector and an LED chip. The reflector is disposed on the carrier substrate and includes a base, a magnesium fluoride layer and a cerium dioxide layer. The base has an opening to expose a part of the carrier substrate. The magnesium fluoride layer is disposed on the inside wall of the opening and the cerium dioxide layer is disposed on the magnesium fluoride layer. The LED chip is disposed in the opening and located on the carrier substrate.

11 Claims, 3 Drawing Sheets

LIGHT EMITTING DIODE PACKAGE STRUCTURE AND METHOD THEREOF

CROSS-REFERENCE TO RELATED APPLICATION

This application claims the priority benefit of Taiwan application serial No. 98102914, filed on Jan. 23, 2009. The entirety of the above-mentioned patent application is hereby incorporated by reference herein and made a part of this specification.

BACKGROUND OF THE INVENTION

1. Field of the Invention

The present invention generally relates to a light emitting diode (LED) package structure and a fabrication method thereof, and more particularly, to an LED package structure with high luminance and a fabrication method thereof.

2. Description of Related Art

In recent years, due to the increasing luminance of an LED, in some fields, the LED has gradually replaced a fluorescent lamp and an incandescent bulb to become a very useful light source, for example, a scanner light source with fast response, a back light source or a front light source for an LCD, an illumination means for instrument panel of automobile, a traffic light and regular lighting apparatuses.

FIG. 1 is a cross-sectional diagram of a conventional LED package structure. Referring to FIG. 1, a conventional LED package structure 100 includes an LED chip 110, a carrier substrate 120, two metal wires 132 and 134 and an encapsulant 140. The LED chip 110 is disposed on the carrier substrate 120 and the two metal wires 132 and 134 are respectively electrically connected between the LED chip 110 and the carrier substrate 120. The encapsulant 140 is disposed on the carrier substrate 120 and encapsulates the two metal wires 132 and 134.

SUMMARY OF THE INVENTION

Accordingly, the present invention is directed to an LED package structure with better luminance.

The present invention is also directed to a fabrication method of an LED package structure, by which the luminance of the LED package structure can be effectively increased.

The present invention provides an LED package structure, which includes a carrier substrate, a reflector and an LED chip. The reflector is disposed on the carrier substrate and includes a base, a magnesium fluoride layer and a cerium dioxide layer. The base has an opening to expose a part of the carrier substrate. The magnesium fluoride layer is disposed on the inside wall of the opening and the cerium dioxide layer is disposed on the magnesium fluoride layer. The LED chip is disposed in the opening and located on the carrier substrate.

In an embodiment of the present invention, the opening has a first end and a second end, the first end is located on the carrier substrate, the second end is located at a place far away from the carrier substrate and the diameter of the second end is greater than the diameter of the first end.

In an embodiment of the present invention, the inside wall of the opening is an inclined surface.

In an embodiment of the present invention, the magnesium fluoride layer is further disposed on the part adjacent to the opening of the base.

In an embodiment of the present invention, the LED package structure further includes a transparent material layer, which is disposed in the opening and covers the LED chip.

In an embodiment of the present invention, the transparent material layer and the cerium dioxide layer are independent from each other.

The present invention also provides a fabrication method of an LED package structure as follows. First, a carrier substrate and at least an LED chip are provided, wherein the LED chip is disposed on the carrier substrate. Next, a base having an opening is provided. Then, a magnesium fluoride layer is formed on the inside wall of the opening. After that, a cerium dioxide layer is formed on the magnesium fluoride layer. Further, the base is disposed on the carrier substrate to make the LED chip located in the opening.

In an embodiment of the present invention, the method for forming the magnesium fluoride layer and the cerium dioxide layer includes evaporation process.

In an embodiment of the present invention, the fabrication method of an LED package structure further includes injecting argon gas during conducting the evaporation process.

In an embodiment of the present invention, the fabrication method of an LED package structure further includes conducting a film-pressing process to form a transparent material layer covering the LED chip.

In an embodiment of the present invention, the fabrication method of an LED package structure further includes conducting a wire bonding process so that the LED chip is electrically connected to the carrier substrate.

According to the described above, in the present invention, the magnesium fluoride layer and the cerium dioxide layer are formed on the reflector, where a difference of refractive indexes between the cerium dioxide and the magnesium fluoride is used to increase the reflectivity of the reflector so as to increase the luminance of the LED package structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
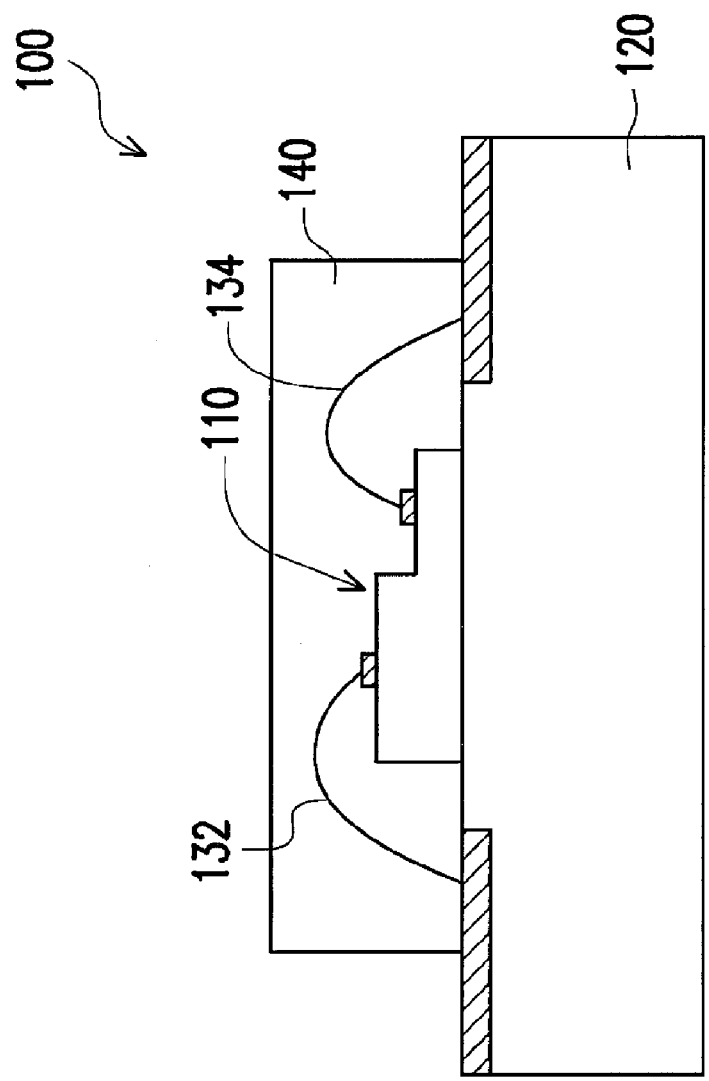
FIG. 1 is a cross-sectional diagram of a conventional LED package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
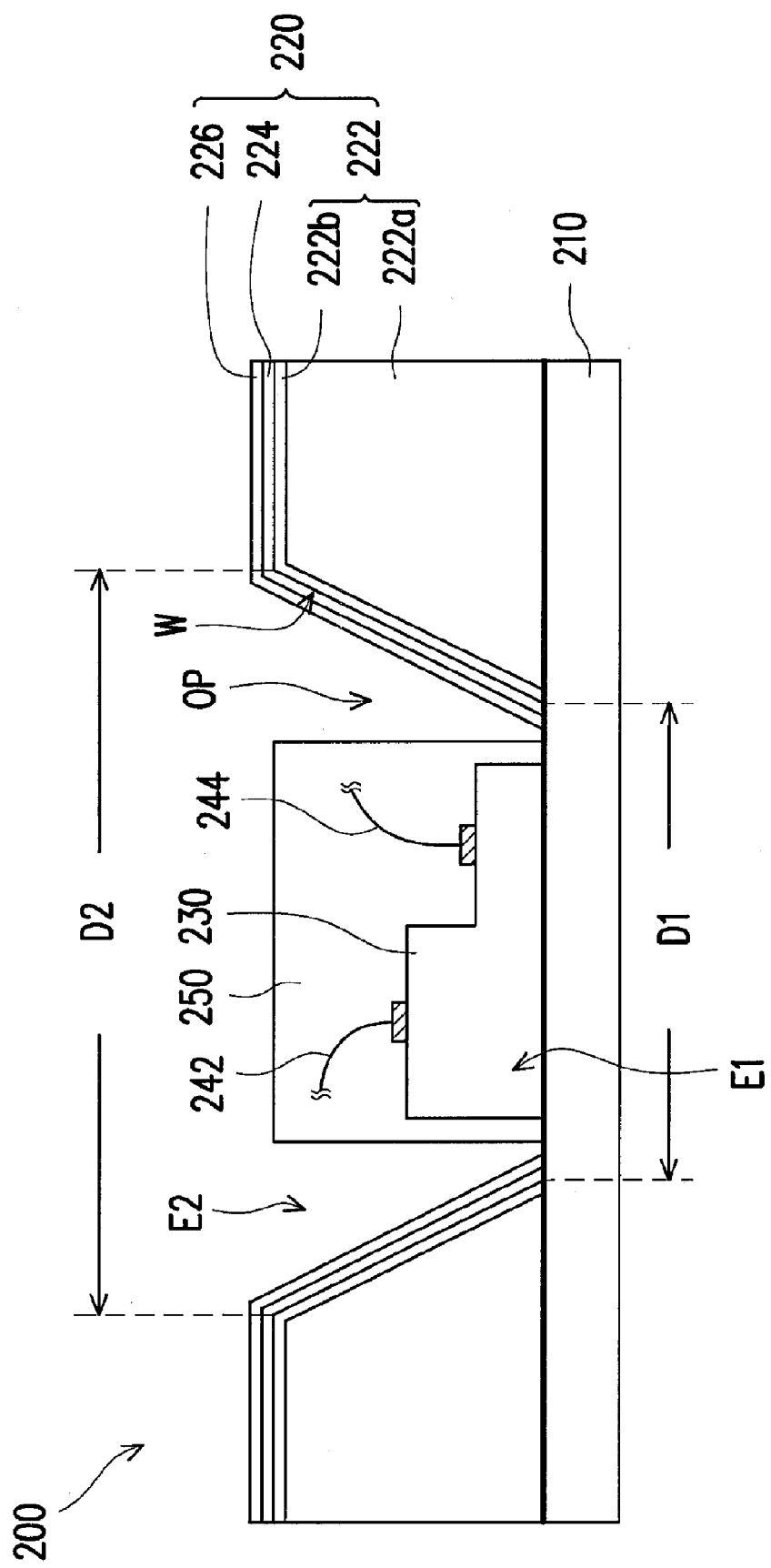
FIG. 2 is a cross-sectional diagram of an LED package structure according to an embodiment of the present invention.

FIG. 2 is a cross-sectional diagram of an LED package structure according to an embodiment of the present invention. Referring to FIG. 2, a LED package structure 200 of the embodiment includes a carrier substrate 210, a reflector 220 and an LED chip 230.

The reflector 220 is disposed on the carrier substrate 210, wherein the carrier substrate 210 is, for example, a circuit board. The reflector 220 includes a base 222, a magnesium fluoride layer 224 and a cerium dioxide layer 226. The base 222 has an opening OP and the opening OP exposes a part of the carrier substrate 210. In the embodiment, the base 222 includes a base layer 222a and a reflection layer 222b, wherein the reflection layer 222b covers the base layer 222a, and the material of the reflection layer 222b is, for example, silver.

In the embodiment, the opening OP is, for example, a round opening. The opening OP has a first end E1 and a second end E2. The first end E1 is located on the carrier substrate, the second end E2 is located at a place far away from the carrier substrate 210 and the diameter D2 of the second end E2 is greater than the diameter D1 of the first end E1. The inside wall W of the opening OP is, for example, an inclined surface.

The magnesium fluoride layer 224 is disposed on the inside wall W of the opening OP. The cerium dioxide layer 226 is disposed on the magnesium fluoride layer 224. In the embodiment, the magnesium fluoride layer 224 can be also disposed on the part adjacent to the opening OP of the base 222; accordingly, the cerium dioxide layer 226 can be also disposed on the magnesium fluoride layer 224 but located over the part adjacent to the opening OP of the base 222.

It should be noted that since the magnesium fluoride has a refractive index lower than the refractive index of the cerium dioxide, so that the embodiment takes advantage of the difference of the refractive indexes between the cerium dioxide and the magnesium fluoride to increase the reflectivity of the reflector so as to increase the luminance of the LED package structure 200. Additionally, the cerium dioxide layer 226 can protect the magnesium fluoride layer 224.

The LED chip 230 is disposed in the opening OP and located on the carrier substrate 210, where the LED chip 230 is electrically connected to the carrier substrate 210 via two metal wires 242 and 244. In other embodiment, the LED chip 230 can be also electrically connected to the carrier substrate 210 via a plurality of solder balls.

A transparent material layer 250 is disposed in the opening OP for covering and protecting the LED chip 230 and the metal wires 242 and 244. The transparent material layer 250 and the cerium dioxide layer 226 are, for example, independent from each other, and the transparent material layer 250 herein does not cover the cerium dioxide layer 226.

The present invention also provides a fabrication method of the LED package structure 200 as follows.

Figure 3A:
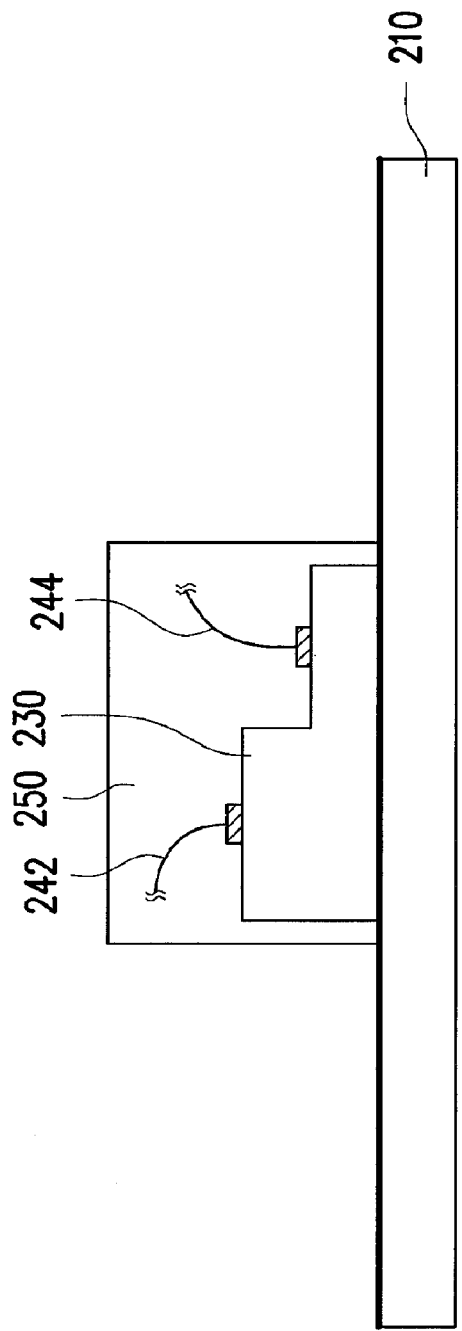
FIGS. 3A and 3B are two cross-sectional diagrams showing a fabrication process of an LED package structure according to an embodiment of the present invention.
Figure 3B:
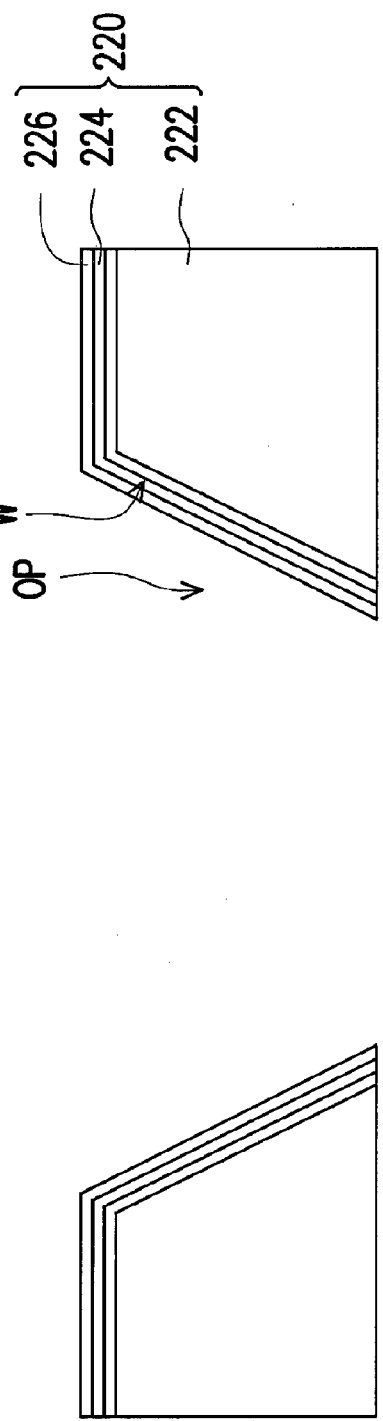

FIGS. 3A and 3B are two cross-sectional diagrams showing a fabrication process of an LED package structure according to an embodiment of the present invention.

First, referring to FIG. 3A, a carrier substrate 210 and an LED chip 230 are provided, wherein the LED chip 230 is disposed on the carrier substrate 210. Next, a wire bonding process is conducted, so that the LED chip 230 is electrically connected to the carrier substrate 210 via two metal wires 242 and 244. Then, a film-pressing process is conducted to form a transparent material layer 250 covering the LED chip 230 and the metal wires 242 and 244.

After that, referring to FIG. 3B, a base 222 is provided, which has an opening OP. Further, a magnesium fluoride layer 224 is formed on the inside wall W of the opening OP. Further, a cerium dioxide layer 226 is formed on the magnesium fluoride layer 224. In the embodiment, the method of forming the magnesium fluoride layer 224 and the cerium dioxide layer 226 includes evaporation process, and argon gas is injected during conducting the evaporation process of the magnesium fluoride layer so as to clean the surface of the base 222 by using the argon gas, which contributes increasing the joint force between the magnesium fluoride and the base 222 and enhancing the striking force of the magnesium fluoride on the base 222 by means of the argon gas to strike the magnesium fluoride.

Further, referring to FIG. 2, the base 222 is disposed on the carrier substrate 210, for example, in adherence way, and the chip 230 is disposed in the opening OP where the opening OP exposes the chip 230.

In summary, in the present invention, the magnesium fluoride layer and the cerium dioxide layer are formed on the reflector, where a difference of refractive indexes between the cerium dioxide and the magnesium fluoride is used to increase the reflectivity of the reflector so as to increase the luminance of the LED package structure. In addition, since the magnesium fluoride layer and the cerium dioxide layer are simultaneously formed during forming the reflector, so that the present invention is compatible with the current fabrication process of an LED package structure.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A light emitting diode package structure, comprising:
   a carrier substrate;
   a reflector, disposed on the carrier substrate, wherein the reflector comprises:
      a base, having an opening to expose a part of the carrier substrate;
      a magnesium fluoride layer, disposed on the inside wall of the opening;
      a cerium dioxide layer, disposed on the magnesium fluoride layer; and
   a light emitting diode chip, disposed in the opening and located on the carrier substrate.

2. The light emitting diode package structure as claimed in claim 1, wherein the opening has a first end and a second end, the first end is located on the carrier substrate, the second end is located at a place far away from the carrier substrate and the diameter of the second end is greater than the diameter of the first end.

3. The light emitting diode package structure as claimed in claim 2, wherein the inside wall of the opening is an inclined surface.

4. The light emitting diode package structure as claimed in claim 1, wherein the magnesium fluoride layer is further disposed on the part adjacent to the opening of the base.

5. The light emitting diode package structure as claimed in claim 1, further comprising:
   a transparent material layer, disposed in the opening and covering the light emitting diode chip.

6. The light emitting diode package structure as claimed in claim 1, wherein the transparent material layer and the cerium dioxide layer are independent from each other.

7. A fabrication method of a light emitting diode package structure, comprising:
   providing a carrier substrate and at least a light emitting diode chip, wherein the light emitting diode chip is disposed on the carrier substrate;
   providing a base having an opening;
   forming a magnesium fluoride layer on the inside wall of the opening;
   forming a cerium dioxide layer on the magnesium fluoride layer; and
   disposing the base on the carrier substrate and making the light emitting diode chip in the opening.

8. The fabrication method of a light emitting diode package structure as claimed in claim 7, wherein the method for forming the magnesium fluoride layer and the cerium dioxide layer comprises evaporation process.

9. The fabrication method of a light emitting diode package structure as claimed in claim 8 further comprising:

injecting argon gas during conducting the evaporation process of the magnesium fluoride layer.

10. The fabrication method of a light emitting diode package structure as claimed in claim 7, further comprising:

conducting a film-pressing process to form a transparent material layer covering the light emitting diode chip.

11. The fabrication method of a light emitting diode package structure as claimed in claim 7, further comprising:

conducting a wire bonding process so that the light emitting diode chip is electrically connected to the carrier substrate.

\* \* \* \* \*